United States Patent
Takagi et al.

(10) Patent No.: US 8,759,812 B2
(45) Date of Patent: Jun. 24, 2014

(54) SEMICONDUCTOR LIGHT EMITTING DEVICE AND METHOD FOR MANUFACTURING SAME

(75) Inventors: Shigeyuki Takagi, Kanagawa-ken (JP); Hidehiko Yabuhara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 13/352,804

(22) Filed: Jan. 18, 2012

(65) Prior Publication Data

US 2012/0181504 A1 Jul. 19, 2012

(30) Foreign Application Priority Data

Jan. 19, 2011 (JP) ................................ 2011-009047

(51) Int. Cl.
| | | |
|---|---|---|
| *H01L 31/00* | (2006.01) | |
| *H01S 5/20* | (2006.01) | |
| *H01S 5/22* | (2006.01) | |
| *H01S 5/227* | (2006.01) | |
| *H01S 5/32* | (2006.01) | |
| *H01S 5/34* | (2006.01) | |

(52) U.S. Cl.
CPC ................ *H01S 5/2022* (2013.01); *H01S 5/22* (2013.01); *H01S 5/2206* (2013.01); *H01S 5/222* (2013.01); *H01S 5/2275* (2013.01); *H01S 5/3213* (2013.01); *H01S 5/3218* (2013.01); *H01S 5/3402* (2013.01)
USPC .......... 257/13; 257/14; 257/15; 257/E33.005; 257/E33.006; 257/E33.007

(58) Field of Classification Search
CPC ....... H01S 5/2022; H01S 5/22; H01S 5/2206; H01S 5/222; H01S 5/2275; H01S 5/3213; H01S 5/3218; H01S 5/3402
See application file for complete search history.

(56) References Cited

U.S. PATENT DOCUMENTS

| | | |
|---|---|---|
| 6,023,073 A | 2/2000 | Strite |
| 2004/0126912 A1 | 7/2004 | Beck et al. |

(Continued)

FOREIGN PATENT DOCUMENTS

| | | |
|---|---|---|
| JP | 2002-76516 A | 3/2002 |
| JP | 2003-526214 A | 9/2003 |

(Continued)

OTHER PUBLICATIONS

The Extended European Search Report issued Jul. 5, 2012, in Application No. / Patent No. 11180179.1-1218.

(Continued)

*Primary Examiner* — Yasser A Abdelaziez
(74) *Attorney, Agent, or Firm* — Oblon, Spivak, McClelland, Maier & Neustadt, L.L.P.

(57) ABSTRACT

According to an embodiment, a semiconductor light emitting device is configured to emit light by energy relaxation of an electron between subbands of a plurality of quantum wells. The device includes an active layer and at least a pair of cladding layers. The active layer is provided in a stripe shape extending in a direction parallel to an emission direction of the light, and includes the plurality of quantum wells; and the active layer emits the light with a wavelength of 10 μm or more. Each of the cladding layers is provided both on and under the active layer respectively and have a lower refractive index than the active layer. At least one portion of the cladding layers contains a material having a different lattice constant from the active layer and has a lower optical absorption at a wavelength of the light than the other portion.

18 Claims, 13 Drawing Sheets

(56) References Cited

U.S. PATENT DOCUMENTS

| | | |
|---|---|---|
| 2007/0114919 A1 | 5/2007 | Sotoyama |
| 2008/0233387 A1 | 9/2008 | Kambe et al. |
| 2010/0252823 A1 | 10/2010 | Kambe et al. |

FOREIGN PATENT DOCUMENTS

| | | |
|---|---|---|
| JP | 2004-247492 | 9/2004 |
| JP | 2005-39045 | 2/2005 |
| JP | 2006-135256 A | 5/2006 |
| JP | 2008-218915 A | 9/2008 |

OTHER PUBLICATIONS

Japanese Office Action issued on Feb. 21, 2013, in patent Application No. 2011-009047 with English translation.

Michel Rochat, et al., "Long-wavelength ($\lambda$=16 µm), room-temperature, single-frequency quantum-cascade lasers based on a bound-to-continuum transition", Applied Physics Letters, vol. 79, No. 26, Dec. 24, 2001, pp. 4271-4273.

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from Japanese Patent Application No. 2011-009047, filed on Jan. 19, 2011; the entire contents of which are incorporated herein by reference.

FIELD

Embodiments described herein are related generally to a semiconductor light emitting device and a method for manufacturing the same.

BACKGROUND

Semiconductor light emitting devices that emit light in the infrared region have a wide field of application such as environmental measurement. Among them, semiconductor light emitting devices that emit coherent light, such as a quantum cascade laser, are small and highly convenient, and enable high-accuracy measurement.

For example, a quantum cascade laser that emits infrared light with a wavelength of 4 to 10 μm includes an active layer including quantum wells in which GaInAs and AlInAs are alternately stacked, and has a structure in which an InP cladding layer surrounds the active layer.

On the other hand, in a wavelength region with wavelengths longer than 10 μm, there is light absorption due to lattice vibrations (phonons) of InP, and the InP cladding layer absorbs the light emitted from the active layer. Consequently, the light emitting efficiency decreases, and it is difficult to obtain a high-power quantum cascade laser. Thus, a high-power semiconductor light emitting device that emits light is required in the far-infrared region with wavelengths longer than 10 μm.

BRIEF DESCRIPTION OF THE DRAWINGS

FIG. 3A to FIG. 5B are schematic cross-sectional views illustrating manufacturing processes of the semiconductor light emitting device according to the first embodiment;

FIG. 8A to FIG. 10B are schematic cross-sectional views illustrating manufacturing processes of the semiconductor light emitting device according to the second embodiment;

FIG. 12A to FIG. 15B are schematic cross-sectional views illustrating manufacturing processes of the semiconductor light emitting device according to the third embodiment;

DETAILED DESCRIPTION

In general, according to an embodiment, a semiconductor light emitting device is configured to emit light by energy relaxation of an electron between subbands of a plurality of quantum wells. The device includes an active layer and at least a pair of cladding layers. The active layer is provided in a stripe shape extending in a direction parallel to an emission direction of the light, and includes the plurality of quantum wells; and the active layer emits the light with a wavelength of 10 μm or more. The pair of cladding layers is provided along the extending direction in the stripe shape and have a lower refractive index than the active layer, each of the cladding layers being provided both on the active layer and under the active layer respectively. At least one portion of the cladding layers contains a material having a different lattice constant from the active layer and has a lower optical absorption at a wavelength of the light than the other portion containing a material lattice-matched to the active layer.

Hereinbelow, embodiments of the invention are described with reference to the drawings. In the following embodiments, identical components in the drawings are marked with the same reference numerals, and a detailed description thereof is omitted as appropriate and different components are described.

First Embodiment

Figure 1A:
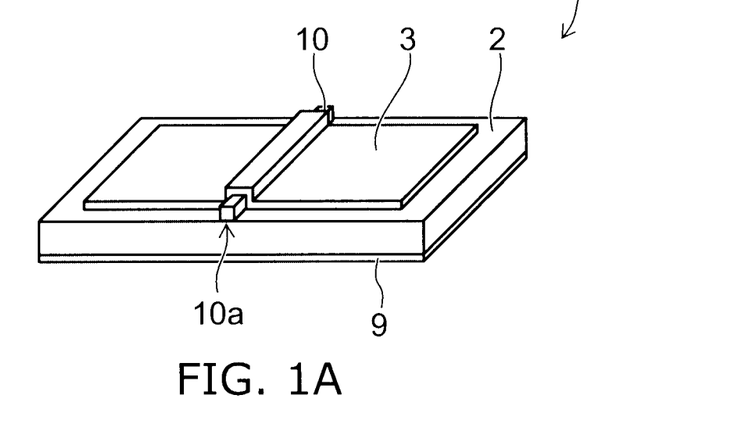
FIGS. 1A and 1B are schematic views illustrating a semiconductor light emitting device according to a first embodiment.
Figure 1B:
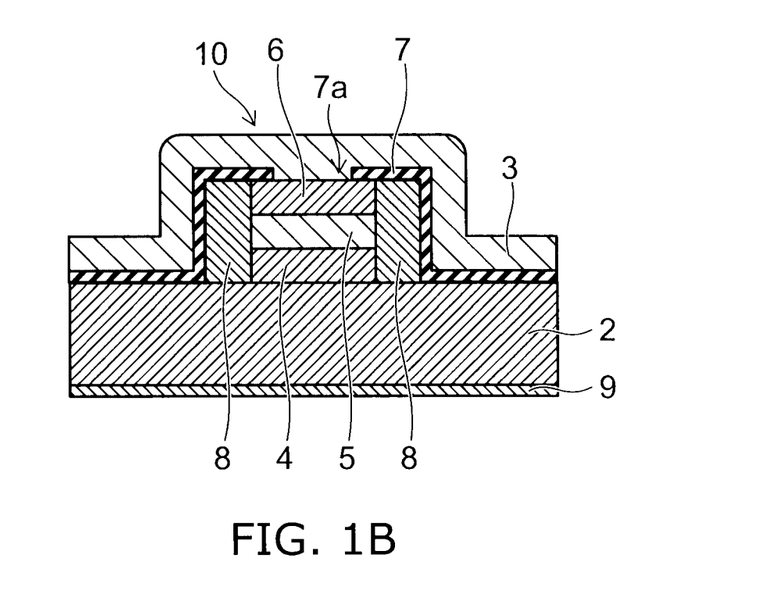

FIGS. 1A and 1B are schematic views showing a semiconductor light emitting device 100 according to the embodiment. The semiconductor light emitting device 100 is, for example, a quantum cascade laser that emits laser light with a wavelength of 10 μm or more by the energy relaxation of electrons between subbands of a plurality of quantum wells.

FIG. 1A is a perspective view schematically showing the semiconductor light emitting device 100. The semiconductor light emitting device 100 includes a semiconductor substrate 2 and a ridge portion (laser stripe) 10 provided on the semiconductor substrate 2.

FIG. 1B is a schematic view showing one end surface 10a of the ridge portion 10. The ridge portion 10 includes an active layer 5 that emits emission light with a wavelength of 10 μm or more and cladding layers 4, 6, and 8 provided therearound.

The active layer 5 is provided in a stripe shape including a plurality of quantum wells, and extends in the direction parallel to the emission light (laser light) emitted from the end surface 10a. The cladding layers 4, 6, and 8 are provided along the extending direction of the stripe shaped active layer 5.

Multiple quantum wells formed by stacking GaInAs well layers and AlInAs barrier layers lattice-matched to InP, for example, are used for the active layer 5. An InP substrate is used as the substrate 2, and the active layer 5 and the cladding layer 6 are provided via the cladding layer 4. The cladding layer 4 and 6 are provided both on the active layer 5 and under the active layer 5 respectively. Both of the cladding layers 4 and 6 are InP layers. On the other hand, the GaAs cladding layer 8 is provided on the side surfaces of the active layer 5.

Here, "lattice-matching" includes not only the case where the lattice constants of two crystals coincide but also the case where the difference between the lattice constants of both is, for example, within 0.5%.

An insulating film 7 is provided on the surface of the semiconductor substrate 2 and the side surfaces and the upper surface of the ridge portion 10, and an electrode 3 is formed thereon. In the insulating film 7 provided on the upper surface of the ridge portion 10, a contact hole 7a is provided above the active layer 5, and the surface electrode 3 is in contact with the cladding layer 6. Laser light can be emitted from the active layer 5 by applying a driving voltage between the surface electrode 3 and a backside electrode 9 to pass a driving current from the InP cladding layer 6 to the semiconductor substrate side via the active layer 5 and the InP cladding layer 4.

On the other hand, the side surface and the upper surface of the GaAs cladding layer 8 are covered with the insulating film 7 to reduce the current flowing to the semiconductor substrate side via the GaAs cladding layer 8. Thereby, the current flows dominantly through the active layer 5, improving the light emitting efficiency. Alternatively, forming the cladding layer 8 using semi-insulating GaAs may reduce the current flowing via the cladding layer 8.

Figure 2:
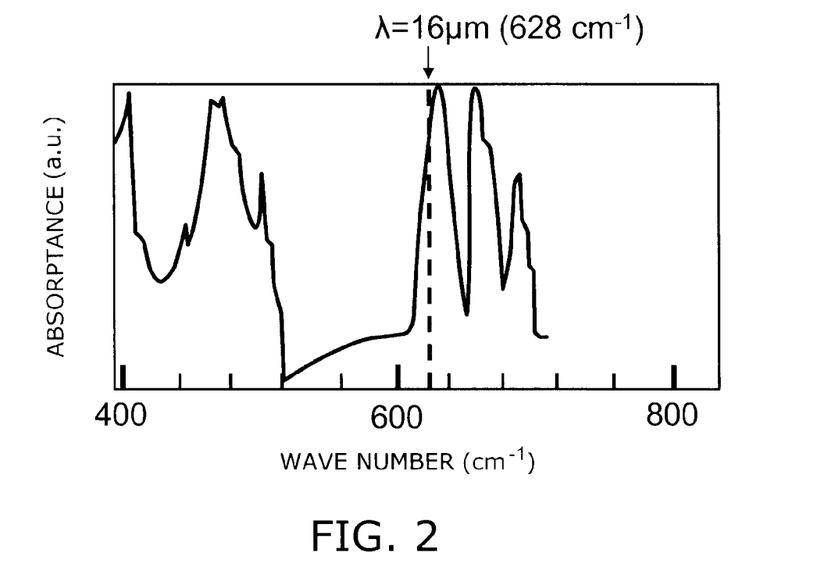
FIG. 2 is a graph showing the absorption spectrum of InP.

FIG. 2 is a graph showing the absorption spectrum of InP. The horizontal axis represents the wave number of light, and the vertical axis represents the absorptance of light. In the case of InP, as shown in the graph, there is an absorption peak of phonons near the wavelength of 16 μm (wave number: 628 $cm^{-1}$). In the case where the wavelength of the light emitted from the active layer 5 is 16 μm, the InP cladding layers 4 and 6 absorb the light emitted from the active layer 5.

On the other hand, the absorption peak of optical phonons in GaAs is present near the light wavelength of 17 μm. Therefore, the absorptance for light of a wavelength of 16 μm in the GaAs cladding layer 8 is lower than that in the InP cladding layers 4 and 6.

That is, in a semiconductor light emitting device that emits laser light with a wavelength of 16 μm, the light emitting efficiency can be improved by using GaAs, which is a material of a relatively low optical absorption, for at least part of the cladding layer surrounding the active layer 5, as compared to the case where an InP layer is used as the entire cladding layer around the active layer 5. The semiconductor light emitting device 100 according to the embodiment can improve the light emitting efficiency and increase the optical output by using the GaAs cladding layer 8.

Next, the manufacturing processes of the semiconductor light emitting device 100 are described with reference to FIG. 3A to FIG. 5B. FIG. 3A to FIG. 5B schematically show a partial cross-section of the semiconductor substrate 2.

Figure 3A:
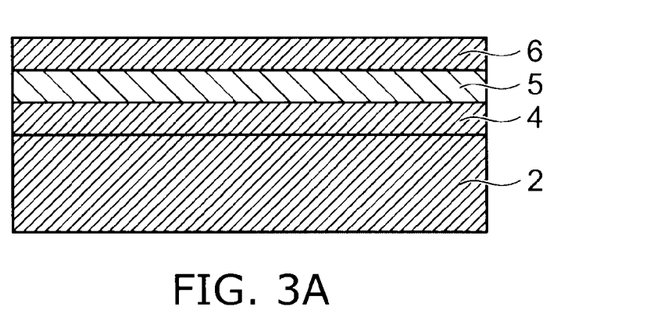

FIG. 3A shows a state where the cladding layer 4, the active layer 5, and the cladding layer 6 are sequentially stacked on the semiconductor substrate 2. The semiconductor substrate 2 is, for example, an InP substrate. Specific examples of the cladding layer 4, the active layer 5, and the cladding layer 6 provided on the InP substrate are shown Table 1. A guide layer (not shown) may be provided between the cladding layers 4 and 6 and the active layer 5.

TABLE 1

|  | Material | Refractive Index | Thickness d (μm) |
| --- | --- | --- | --- |
| Cladding layer 4 | InP | 3.089 | 1 ≤ d ≤ 5 |
| Guide layer | GaInAs | 3.427 | d < 1 |
| Active layer 5 | GaInAs/AlInAs | 3.273 | 1 ≤ d ≤ 5 |
| Guide layer | GaInAs | 3.427 | d < 1 |
| Cladding layer 5 | InP | 3.089 | 1 ≤ d ≤ 5 |

$Ga_xIn_{1-x}As$ and $Al_yIn_{1-y}As$ (x and y represent compositions, respectively) having a lattice constant matched to InP are used for the active layer 5. Thereby, the crystal defect density is reduced in the layers stacked on the InP substrate, and the lower defect density may improve the light emitting efficiency.

In the case where the active layer 5 includes a quantum well formed by combining GaInAs and AlInAs, for example, InP and GaAs may be preferably used as the cladding layer. In the semiconductor device 100, InP is used as the cladding layers 4 and 6. As shown in Table 1, the refractive index of the InP cladding layers 4 and 6 is lower than the active layer 5. Thereby, emission light can be confined in the active layer 5 provided in a stripe shape to guide the light in the stripe direction. A guide layer made of GaInAs may be further provided in order to strengthen the light confinement of the active layer 5.

Examples of the thicknesses of the semiconductor layers are shown in Table 1. The thickness of the entire active layer 5 is, for example, 1 to 5 μm, and the quantum well included in the active layer 5 is adjusted so that an energy gap between subbands is matched to a desired emission wavelength. That is, the thicknesses of the GaInAs layer and AlInAs layer are adjusted to form a suitable quantum well structure.

Figure 3B:
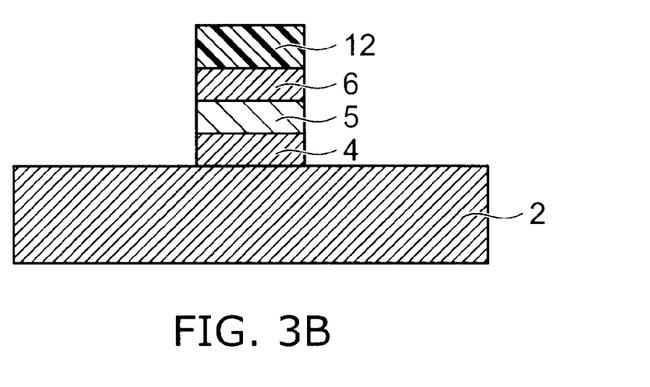

Next, as shown in FIG. 3B, an etching mask 12 is formed on the surface of the cladding layer 6; and the cladding layer 6, the active layer 5, and the cladding layer 4 are etched into a mesa structure using the RIE (reactive ion etching) method, for example. Thereby, the active layer 5 in a stripe shape can be formed.

Figure 4A:
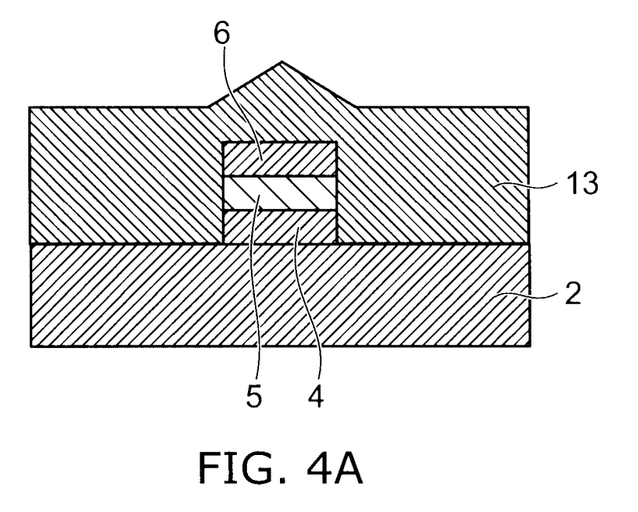

Subsequently, as shown in FIG. 4A, the etching mask 12 is removed, and a GaAs layer 13 is formed on the surface of the semiconductor substrate 2, whereby the cladding layer 4, the active layer 5, and the cladding layer 6 in a mesa structure are embedded under the GaAs layer 13.

Figure 4B:
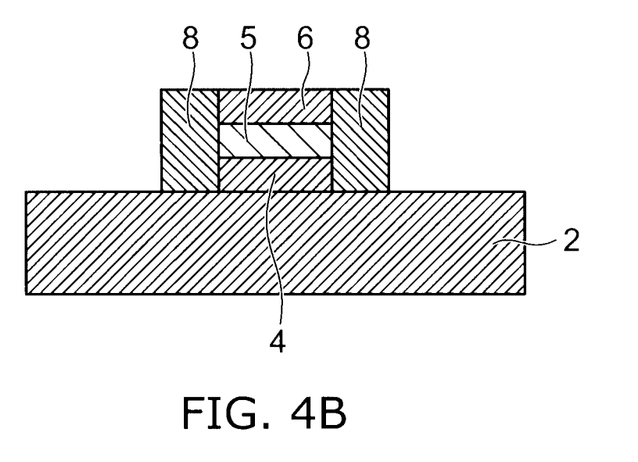

Next, as shown in FIG. 4B, the mesa structure including the cladding layer 4, the active layer 5, the cladding layer 6 and the cladding layer 8 is formed by etching the GaAs layer 13, wherein the GaAs layer 13 remains as the cladding layer 8 on both sides of the mesa structure. That is, the surface of the GaAs layer 13 is planarized by using, for example, the CMP (chemical mechanical polish) method, and then the GaAs layer 13 is etched to expose the surface of the cladding layer 6 and to leave portions thereof as the cladding layers 8 on both sides of the mesa structure.

Figure 5A:
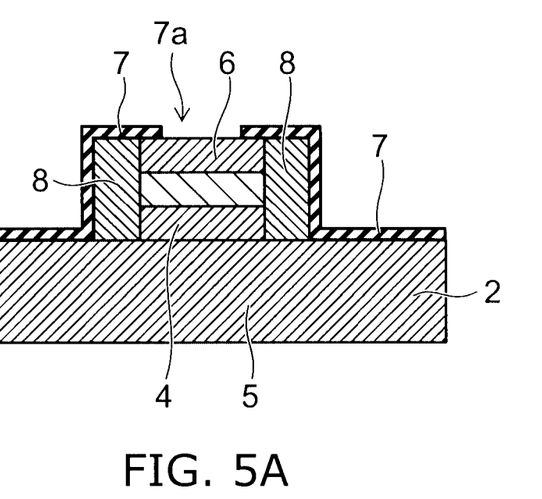

Subsequently, as shown in FIG. 5A, the insulating film 7 is formed so as to cover the surfaces of the semiconductor substrate 2 and the cladding layers 6 and 8. The insulating film 7 is, for example, a silicon oxide film ($SiO_2$ film) formed by using the sputtering method. Then, the contact hole 7a is formed on the surface of the cladding layer 6.

Next, the electrode 3 is formed on the insulating film 7. The electrode 3 is electrically connected to the cladding layer 6 via the contact hole 7a. Subsequently, the backside electrode 9 is formed on the back surface of the semiconductor substrate 2; thus, the semiconductor light emitting device 100 is completed.

In the manufacturing processes mentioned above, the cladding layers 4 and 6, the active layer 5, and the GaAs layer 13 can be formed using, for example, the MOCVD (metal organic chemical vapor deposition) method.

Second Embodiment

Figure 6:
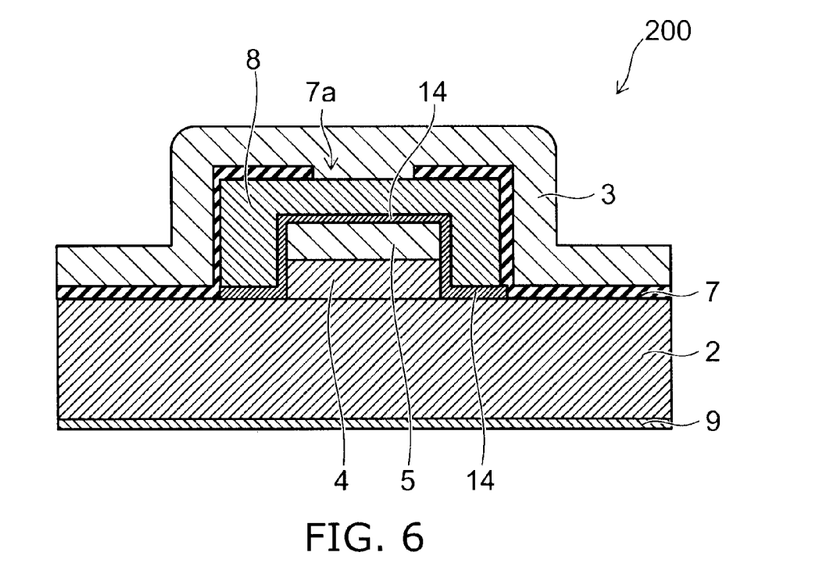
FIG. 6 is a schematic view illustrating an end surface of a semiconductor light emitting device according to a second embodiment.

FIG. 6 is a schematic view showing an end surface of a semiconductor light emitting device 200 according to a second embodiment. Similarly to the semiconductor light emitting device 100 described above, the semiconductor light emitting device 200 is, for example, a quantum cascade laser that emits laser light with a wavelength of 10 μm or more.

As shown in FIG. 6, the semiconductor light emitting device 200 differs from the semiconductor light emitting device 100 in that the cladding layer 8 provided on the active layer 5 is a GaAs layer. Furthermore, there is a difference also in that a buffer layer 14 is provided between the active layer 5 and the cladding layer 8.

There is a lattice mismatch of approximately 3.7% between the lattice constant of InP and the lattice constant of GaAs, for example. Therefore, if a GaAs layer is formed directly on the surface of the active layer 5 containing GaInAs and AlInAs lattice-matched to InP, a crystal defect would be generated due to the lattice mismatch between the GaAs and the active layer 5. In view of this, the crystal defects generated in the GaAs layer can be reduced by inserting the buffer layer 14 having a lattice constant intermediate between the lattice constant of InP and the lattice constant of GaAs.

Figure 7:
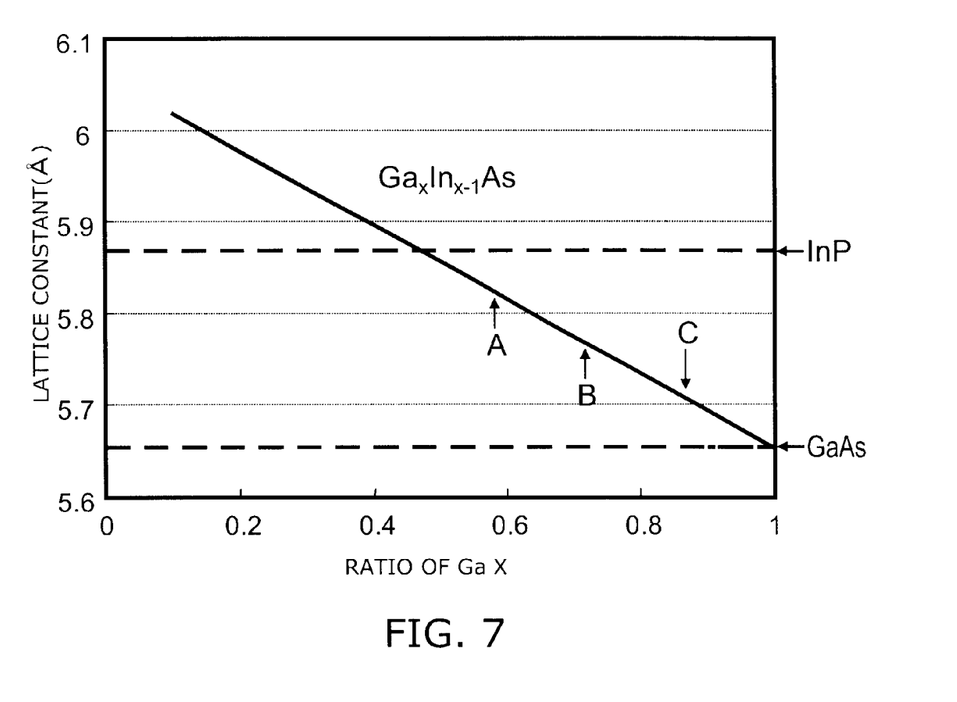
FIG. 7 is a graph showing a relationship between a lattice constant and composition x in $Ga_xIn_{1-x}As$.

FIG. 7 is a graph showing the lattice constant of $Ga_xIn_{1-x}As$ to the composition x. For example, it can be seen that the lattice constant of InP is approximately 5.87 Å and $Ga_xIn_{1-x}As$ is lattice-matched to InP when the composition x is set to 0.47. On the other hand, $Ga_xIn_{1-x}As$ is GaAs when the composition x is set to 1. Therefore, $Ga_xIn_{1-x}As$ with a composition x between 0.47 and 1 has an intermediate lattice constant between the lattice constant of InP and the lattice constant of GaAs.

That is, $Ga_xIn_{1-x}As$ with a composition x in a range of $0.47<x<1$ may be used as the buffer layer 14. For example, a $Ga_xIn_{1-x}As$ layer with a composition x of approximately 0.73 indicated by B in FIG. 7 may be inserted as the buffer layer 14.

Furthermore, the buffer layer 14 may include a plurality of layers with different lattice constants form each other. For example, $Ga_xIn_{1-x}As$ layers having compositions of A, B, and C shown in FIG. 7 may be sequentially inserted from the side of the active layer 5 lattice-matched to InP.

Next, the manufacturing processes of the semiconductor light emitting device 200 are described with reference to FIG. 8A to FIG. 10B. FIG. 8A to FIG. 10B schematically show a partial cross-section of the semiconductor substrate 2.

Figure 8A:
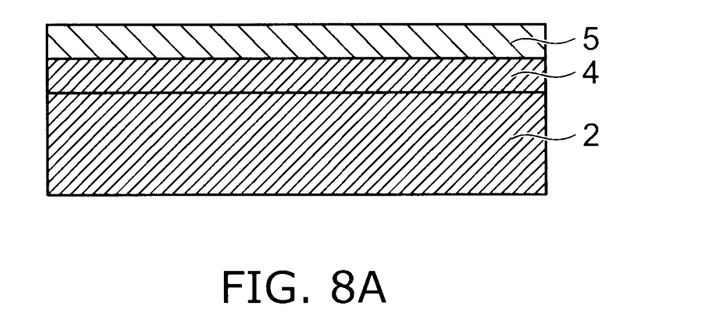
Figure 8B:
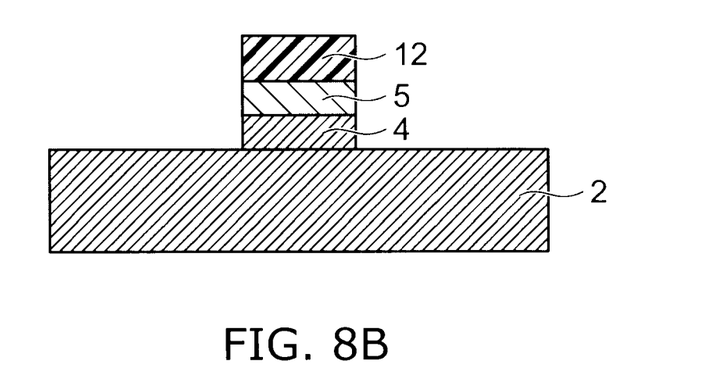

As shown in FIG. 8A, the cladding layer 4 and the active layer 5 are sequentially stacked on the semiconductor substrate 2, for example, the InP substrate. The active layer 5 contains $Ga_xIn_{1-x}As$ and $Al_yIn_{1-y}As$ lattice-matched to InP. Subsequently, as shown in FIG. 8B, an etching mask 12 is formed on the surface of the active layer 5; and the active layer 5 and the cladding layer 4 are etched into a mesa structure.

Figure 9A:
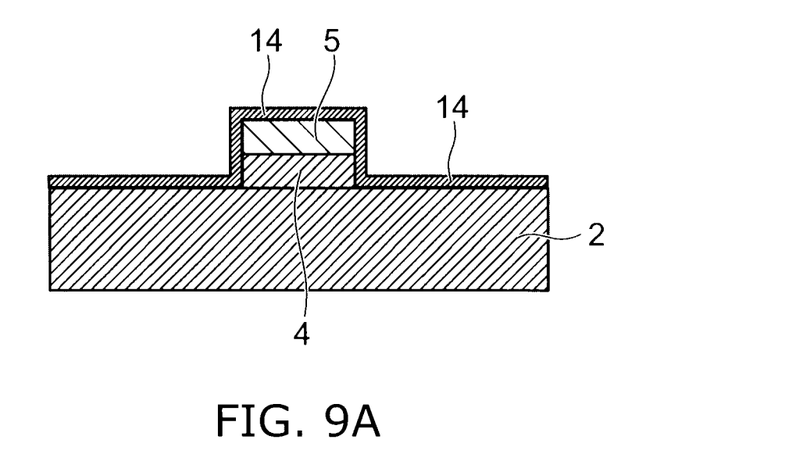

Next, as shown in FIG. 9A, the etching mask 12 is removed, and the buffer layer 14 is formed on the surface of the active layer 5, the side surfaces of the cladding layer 4, and the surface of the substrate 2. $Ga_xIn_{1-x}As$ with a composition x between 0.47 and 1 may be used for the buffer layer 14. Alternatively, a plurality of $Ga_xIn_{1-x}As$ layers with different lattice constants from each other may be stacked in the order from the first layer having the lattice constant nearest to that of InP.

Figure 9B:
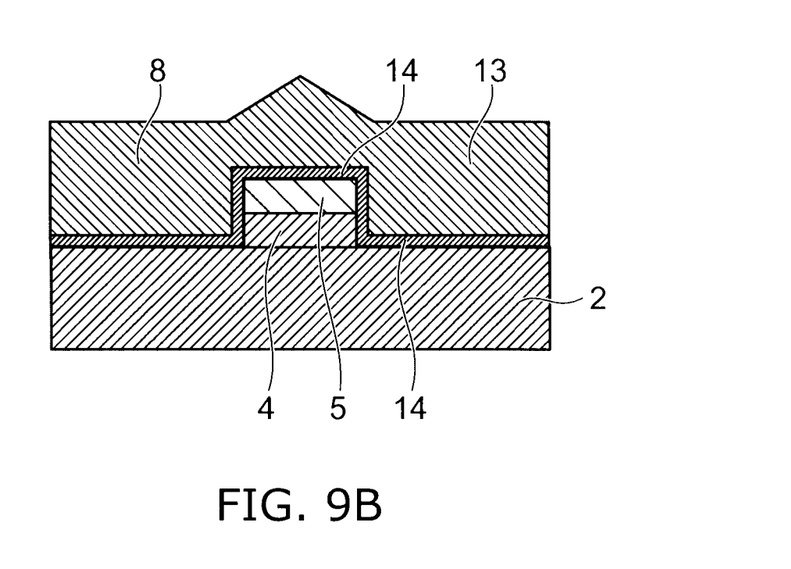

Subsequently, as shown in FIG. 9B, the GaAs layer 13 is formed on the cladding layer 4, the active layer 5 and the buffer layer 14, embedding the cladding layer 4 and the active layer 5 thereunder.

Figure 10A:
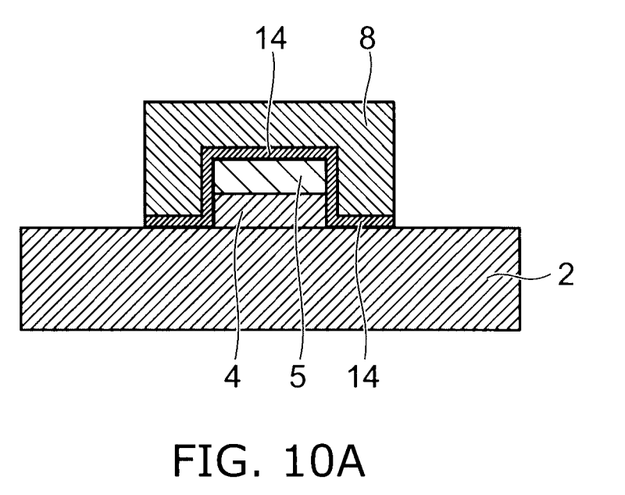

Next, as shown in FIG. 10A, the surface of the GaAs layer is planarized by, for example, the CMP method. Furthermore, the GaAs layer 13 is etched so that a portion thereof may remain as the cladding layer 8 on the side surfaces of the cladding layer 4 and the active layer 5 and the upper surface of the active layer 5.

Figure 10B:
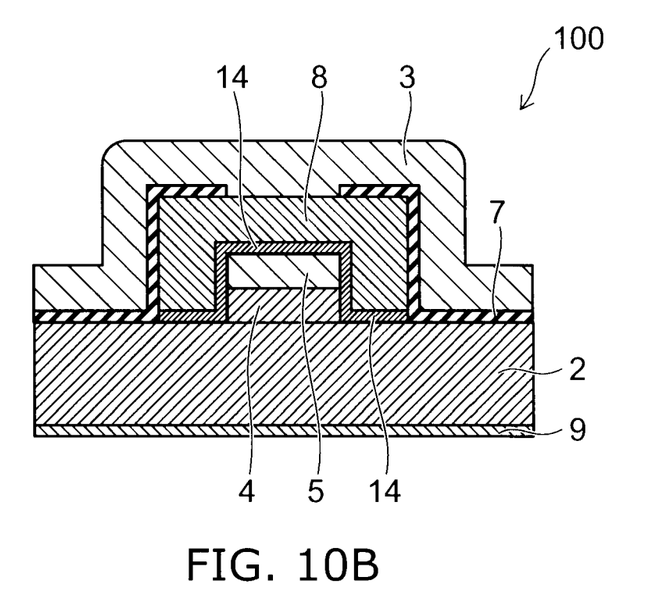

Next, as shown in FIG. 10B, the insulating film 7 is formed so as to cover the surfaces of the semiconductor substrate 2 and the cladding layer 8, and the contact hole 7a is formed in communication with the surface of the cladding layer 8 above the active layer 5. Subsequently, the electrode 3 is formed on the insulating film 7 to be electrically connected to the cladding layer 8 via the contact hole 7a. Furthermore, the backside electrode 9 is formed on the back surface of the semiconductor substrate 2; thus, the semiconductor light emitting device 200 is completed.

As mentioned above, in the semiconductor light emitting device 200 according to the embodiment, inserting the buffer layer 14 between the active layer 5 and the cladding layer 8 may reduce the crystal defects generated in the GaAs cladding layer 8. Thereby, it becomes possible to practically provide the GaAs cladding layer 8 in an active area where a driving current is passed from the surface electrode 3 to the active layer via the contact hole 7a. Providing the GaAs cladding layer 8 on the upper surface of the active layer 5 in addition to the portions provided along both side surfaces of the active layer 5 further reduces the absorption of the emission light that the active layer 5 emits. Thereby, the semiconductor light emitting device 200 may achieve more improved characteristics of light emission than the semiconductor light emitting device 100.

Third Embodiment

Figure 11:
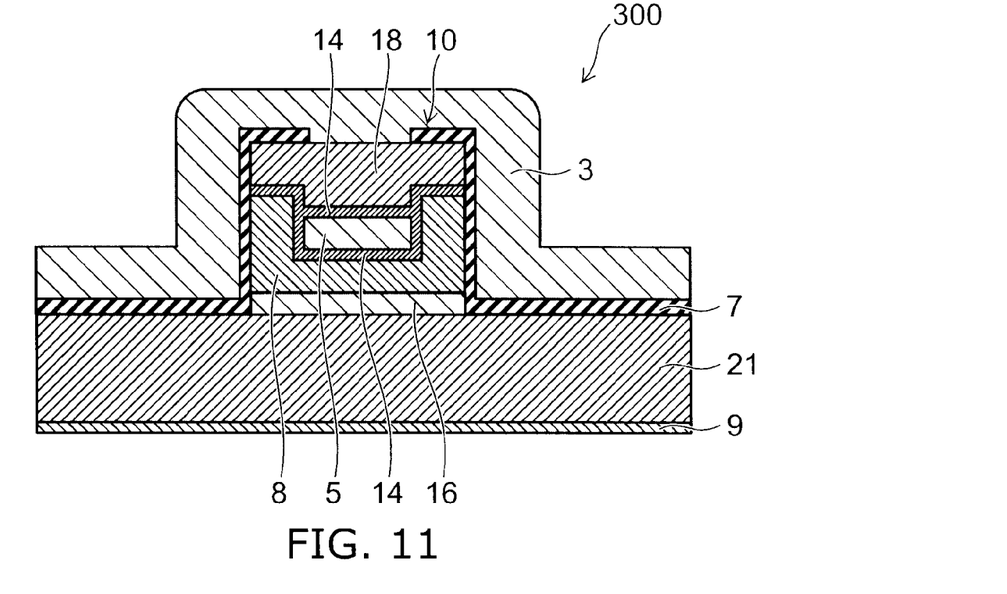
FIG. 11 is a schematic cross-sectional view showing a semiconductor light emitting device according to a third embodiment.

FIG. 11 is a schematic cross-sectional view showing a semiconductor light emitting device 300 according to the embodiment. Also the semiconductor light emitting device 300 is, for example, a quantum cascade laser that emits laser light with a wavelength of 10 μm or more.

As shown in FIG. 11, the semiconductor light emitting device 300 differs from the semiconductor light emitting devices 100 and 200 described above in that the GaAs cladding layer 8 and a GaAs cladding layer 18 are provided around the active layer 5.

For example, the active layer 5 contains GaInAs and AlInAs lattice-matched to InP and is surrounded by the GaAs cladding layers 8 and 18. The wavelength of the emission light emitted from the active layer 5 is different from the wavelength of the optical absorption peak due to phonons of GaAs.

The buffer layer 14 surrounding the active layer 5 is provided between the active layer 5 and the GaAs cladding layers 8 and 18. The buffer layer 14 has an intermediate lattice constant between the lattice constant of InP and the lattice constant of GaAs as described above, and reduces the crystal defects generated in the GaAs cladding layers 8 and 18.

Furthermore, the semiconductor light emitting device 300 differs from the semiconductor light emitting devices 100 and 200 also in that a bonding metal 16 is interposed between a substrate 21 and the cladding layer 8. That is, in the case of the semiconductor light emitting device 300, the manufacturing processes thereof includes a step, where the ridge portion 10 is transferred from on the substrate 2 onto the new substrate 21.

The manufacturing processes of the semiconductor light emitting device 300 will now be described with reference to FIG. 12A to FIG. 15B.

Figure 12A:
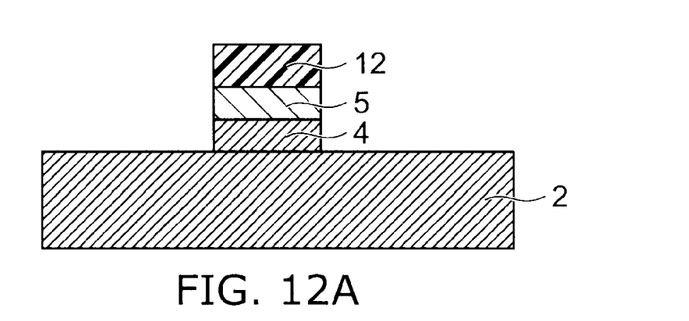

In FIG. 12A, the cladding layer 4 and the active layer 5 provided on the substrate 2 are etched into a mesa structure. It is the same as the state shown in FIG. 8B in the manufacturing processes of the semiconductor light emitting device 200.

Figure 12B:
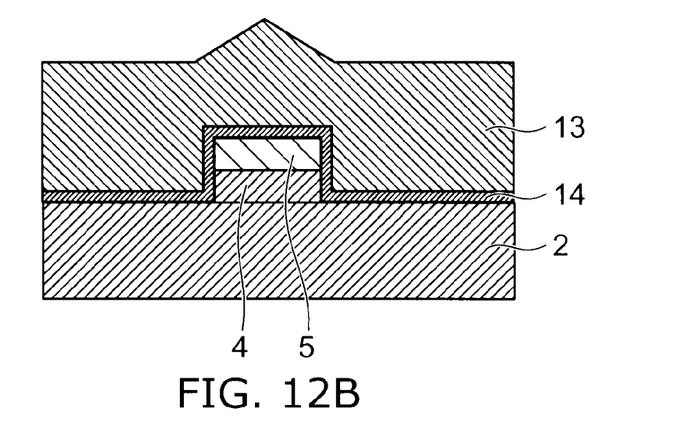

Next, as shown in FIG. 12B, the etching mask 12 is removed; the buffer layer 14 is formed on the surface of the substrate 2, the side surfaces of the cladding layer 4, and the surface of the active layer 5; and subsequently the GaAs layer 13 is formed on the surface of the buffer layer 14, embedding the cladding layer 4 and the active layer 5 formed in a mesa structure.

Figure 13A:
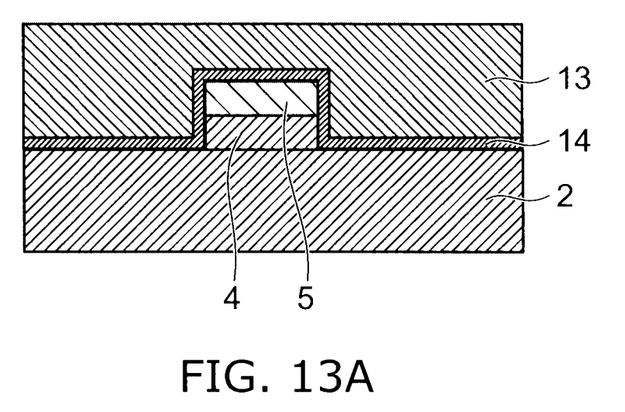
Figure 13B:
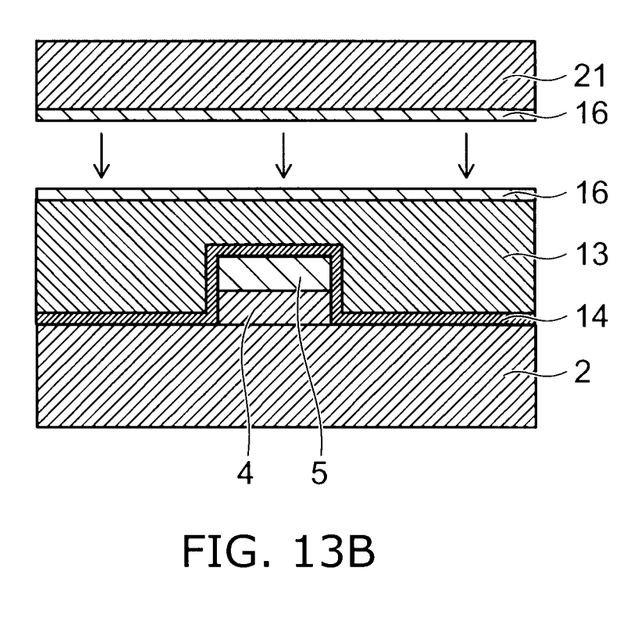

Next, as shown in FIG. 13A, the surface of the GaAs layer 13 is planarized by using, for example, the CMP method. Then, as shown in FIG. 13B, the GaAs layer 13 with the bonding metal 16 formed on its surface and the substrate 21 similarly with the bonding metal 16 formed on its surface are attached together. The substrate 21 and the substrate 2 with the GaAs layer 13 formed thereon are bonded via the bonding metal 16 containing gold (Au) by using, for example, thermocompression bonding method.

Figure 14A:
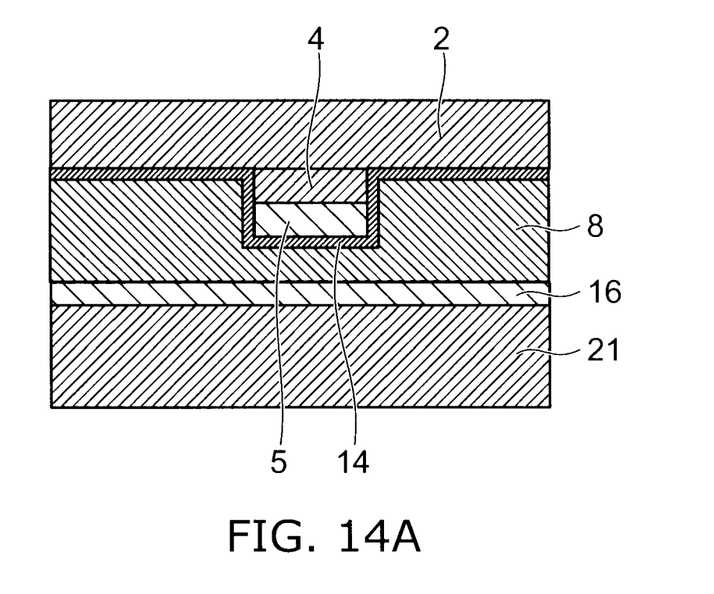

FIG. 14A schematically shows a state where the semiconductor substrate 2 and the substrate 21 are bonded together, with the substrate 21 located on the lower side. A GaAs substrate or an InP substrate, for example, may be used as the substrate 21.

Figure 14B:
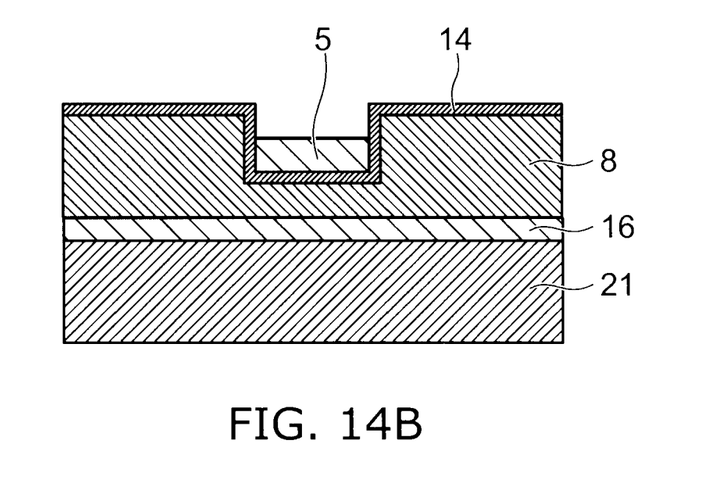

Next, as shown in FIG. 14B, the substrate 2 and the cladding layer 4 are selectively etched and removed. In the case, where hydrochloric acid (HCl) is used as the etchant, the etching rate of InP is higher than the etching rate of GaInAs. Therefore, in the case where the semiconductor substrate 2 is an InP substrate and the cladding layer 4 is InP, it is possible to selectively remove the semiconductor substrate 2 and the cladding layer 4 from the buffer layer 14 containing GaInAs.

Figure 15A:
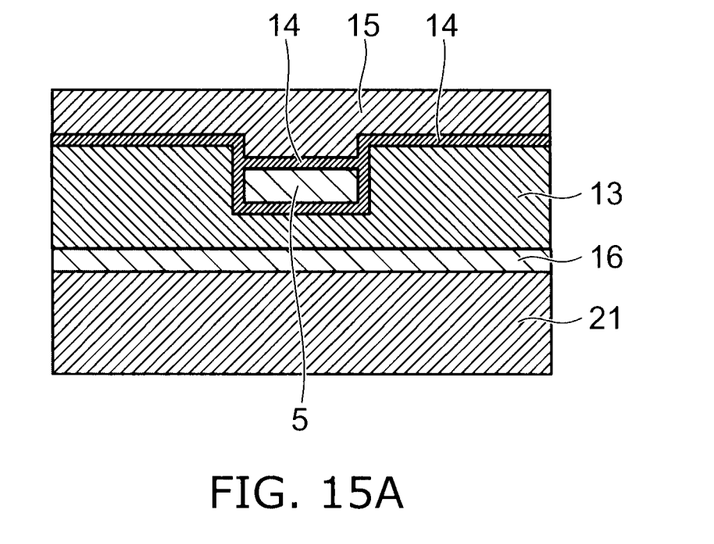

Next, as shown in FIG. 15A, a GaAs layer 15 is grown on the buffer layer 14 from which the semiconductor substrate 2 and the cladding layer 4 have been removed.

Figure 15B:
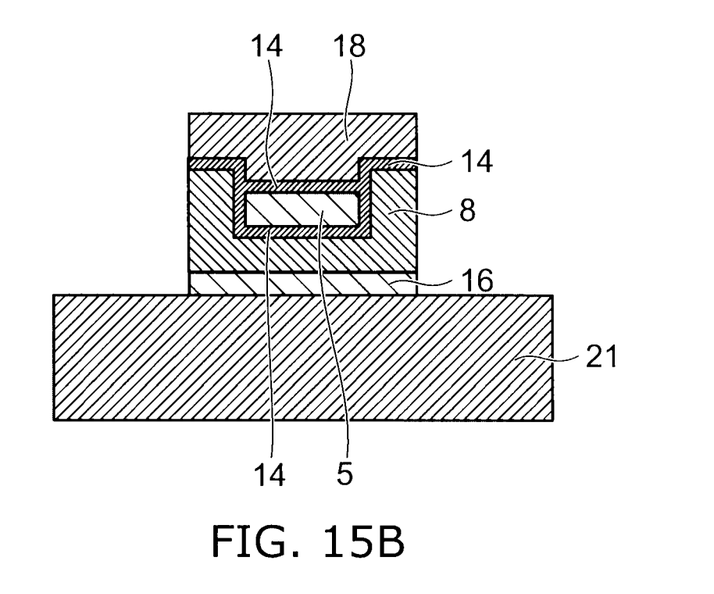

Subsequently, as shown in FIG. 15B, the GaAs layers 13 and 15 are etched so that portions thereof remain as the cladding layer 8 and the cladding layer 18 around the active layer 5.

Figure 5B:
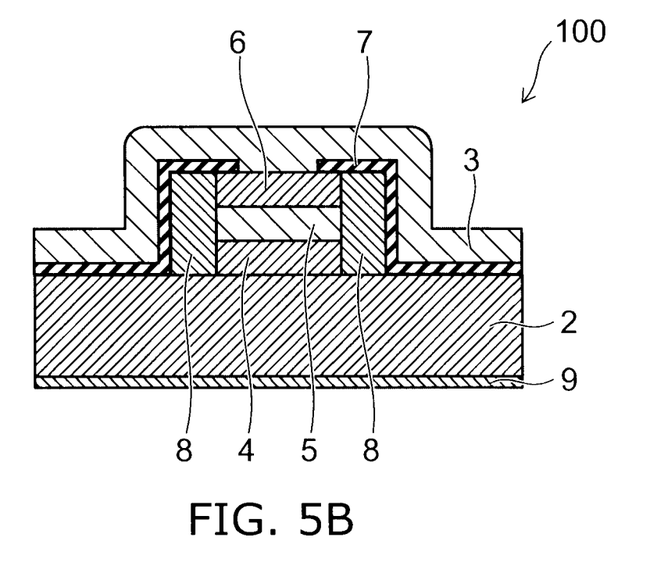

Next, similarly to the manufacturing processes of the semiconductor light emitting device 100 shown in FIGS. 5A and 5B, the insulating film 7 is formed so as to cover the surface of the semiconductor substrate 21 and the surfaces of the cladding layers 8 and 18, and the contact hole 7a is formed in communication with the surface of the cladding layer 18 above the active layer 5. Subsequently, the surface electrode 3 is formed on the insulating film 7 and electrically connected to the cladding layer 18 via the contact hole 7a; the back side electrode 9 is formed on the back surface of the substrate 21; thus, the semiconductor light emitting device 300 is completed.

In the semiconductor light emitting device 300 according to the embodiment, providing the GaAs cladding layers 8 and 18 around the active layer 5 reduce the absorption of emission light, and the light emitting efficiency can be more improved than in the semiconductor light emitting devices 100 and 200.

Fourth Embodiment

Figure 16:
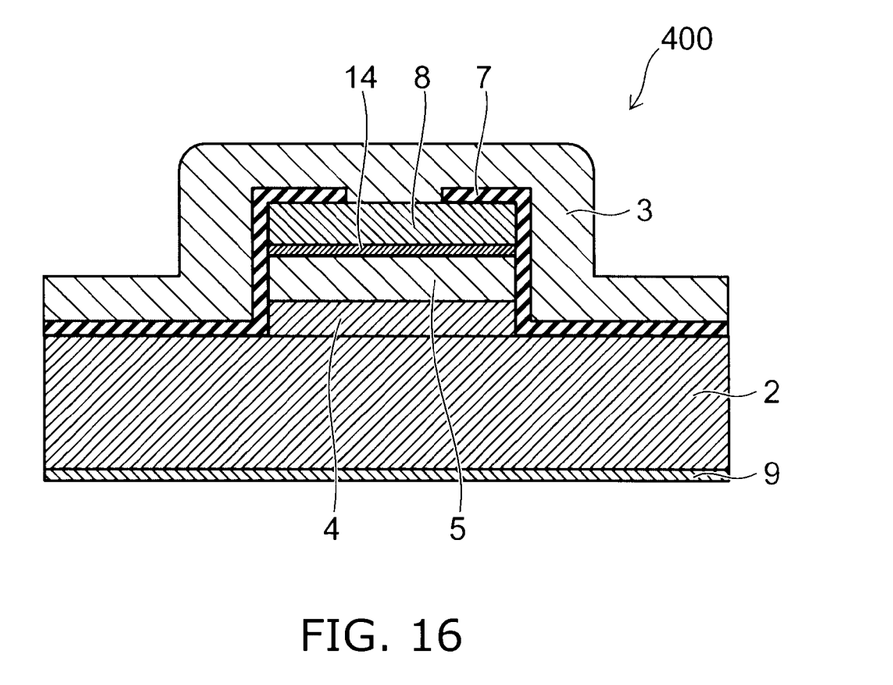
FIG. 16 is a schematic view illustrating an end surface of a semiconductor light emitting device according to a fourth embodiment.

FIG. 16 is a schematic view showing an end surface of a semiconductor light emitting device 400 according to the embodiment. Also the semiconductor light emitting device 400 is a quantum cascade laser that emits laser light with a wavelength of 10 μm or more.

The semiconductor light emitting device 400 differs from the semiconductor light emitting devices 100 to 300 described above in that the cladding layers 4 and 8 are provided respectively both on and under the active layer 5, and no cladding layer is provided on the side surfaces of the active layer 5. The cladding layer 4 is, for example, an InP layer provided on the substrate 2 that is an InP substrate, and the cladding layer 8 is a GaAs layer provided above the active layer 5 via the buffer layer 14.

Assuming that the wavelength of the laser light that the semiconductor light emitting device 400 emits is, for example, 16 μm, the GaAs cladding layer 8 provided above the active layer 5 reduces the absorption of the emission light that the active layer 5 emits. Furthermore, by providing no cladding layer on both sides of the active layer 5, the influence of the optical absorption thereof can be eliminated. Thereby, the semiconductor light emitting device 400 can achieve an improved light emitting efficiency.

Although quantum cascade lasers that emit laser light with a wavelength of 16 μm are used as examples for description in the first to fourth embodiments mentioned above, the invention is not limited thereto. For example, in the case of a quantum cascade laser that emits light in the infrared region, the optical absorption of the semiconductor serving as the material thereof is not brought into question. However, in the far-infrared region with wavelengths longer than 10 μm, for example, a material of low optical absorption for the emission light emitted from the active layer may be selected to be used as at least part of the cladding layer, in view of actions such as the phonon absorption of the semiconductor; thereby, the semiconductor light emitting device can achieve high power.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device configured to emit light by energy relaxation of an electron between subbands of a plurality of quantum wells, the device comprising:
   an active layer provided in a stripe shape extending in a direction parallel to an emission direction of the light, including the plurality of quantum wells, and emitting the light with a wavelength of 10 μm or more; and
   at least a pair of cladding layers provided along the extending direction in the stripe shape and having a lower refractive index than the active layer, each of the cladding layers being provided both on the active layer and under the active layer respectively,
   and at least one portion of the cladding layers containing a material having a different lattice constant from the active layer and having a lower optical absorption at a wavelength of the light than the other portion containing a material lattice-matched to the active layer.

2. The device according to claim 1, wherein the active layer is provided on an InP layer and the portion of the cladding layers contains GaAs.

3. The device according to claim 2, wherein the cladding layers contain GaAs in the portions provided along two opposed side surfaces of the active layer respectively.

4. The device according to claim 3, wherein the portions of the cladding layers provided along the side surfaces are semi-insulating layers.

5. The device according to claim 3, wherein the portions of the cladding layers provided along the side surfaces are covered with an insulating film.

6. The device according to claim 5, wherein the insulating film includes a silicon oxide film.

7. The device according to claim 2, wherein one of the pair of cladding layers contains InP and the other contains GaAs.

8. The device according to claim 2, comprising a buffer layer provided between the active layer and the cladding layer containing GaAs,
   wherein the buffer layer has an intermediate lattice constant between a lattice constant of InP and a lattice constant of GaAs.

9. The device according to claim 8, wherein the buffer layer contains $Ga_xIn_{1-x}As$ with a composition x in a range of $0.47 < x < 1$.

10. The device according to claim 8, wherein
the buffer layer includes a plurality of $Ga_xIn_{1-x}As$ layers with different lattice constants from each other, and each of the $Ga_xIn_{1-x}As$ layers is provided in order of having a lattice constant nearer to InP from the active layer side.

11. The device according to claim 1, wherein the active layer contains GaInAs and AlInAs.

12. The device according to claim 11, wherein the GaInAs and the AlInAs are lattice-matched to InP.

13. The device according to claim 1, further comprising:
a substrate supporting the active layer and the cladding layers;
a electrode electrically connected to the cladding layer; and
a backside electrode provided on a back surface of the substrate.

14. The device according to claim 13, wherein the semiconductor substrate is an InP substrate.

15. A semiconductor light emitting device configured to emit light by energy relaxation of an electron between sub-bands of a plurality of quantum wells, the device comprising:
an active layer provided in a stripe shape extending in a direction parallel to an emission direction of the light, including the plurality of quantum wells, and configured to emit the light with a wavelength of 10 μm or more; and
a cladding layer provided to surround the active layer along the extending direction in a stripe shape and having a lower refractive index than the active layer,
and the cladding layer containing a material having a different lattice constant from the active layer, and a wavelength of the light being different from a wavelength of an optical absorption peak of the cladding layer.

16. The device according to claim 15, wherein the active layer contains GaInAs and AlInAs lattice-matched to InP and the cladding layer contains GaAs.

17. The device according to claim 16, further comprising a buffer layer provided between the active layer and the cladding layer,
wherein the buffer layer has an intermediate lattice constant between a lattice constant of InP and a lattice constant of GaAs.

18. The device according to claim 15, further comprising a substrate supporting the active layer and the cladding layer,
a bonding metal layer being provided between the cladding layer and the substrate.

* * * * *